(12) United States Patent
Pizzi et al.

(10) Patent No.: US 6,983,594 B2
(45) Date of Patent: Jan. 10, 2006

(54) SHAPE MEMORY THIN MICRO-ACTUATOR, AND METHOD FOR PRODUCING THE SAME

(75) Inventors: Marco Pizzi, Turin (IT); Valerian Koniachkine, Turin (IT)

(73) Assignee: C.R.F. Societa Consortile Per Azioni, Turin (IT)

( * ) Notice: Subject to any disclaimer, the term of this patent is extended or adjusted under 35 U.S.C. 154(b) by 0 days.

(21) Appl. No.: 10/842,549

(22) Filed: May 11, 2004

(65) Prior Publication Data

US 2004/0227427 A1 Nov. 18, 2004

(30) Foreign Application Priority Data

May 13, 2003 (IT) .................. TO2003A000347

(51) Int. Cl.
*F01B 29/10* (2006.01)

(52) U.S. Cl. ......................................... 60/527; 60/528

(58) Field of Classification Search .................. 60/527, 60/528, 529

See application file for complete search history.

(56) References Cited

U.S. PATENT DOCUMENTS

| | | | | |
|---|---|---|---|---|
| 4,864,824 A | * | 9/1989 | Gabriel et al. | 60/527 |
| 5,325,880 A | * | 7/1994 | Johnson et al. | 137/1 |
| 5,771,902 A | * | 6/1998 | Lee et al. | 128/897 |
| 6,343,849 B1 | * | 2/2002 | Yun et al. | 347/20 |
| 6,481,821 B1 | * | 11/2002 | Yun et al. | 347/20 |

* cited by examiner

*Primary Examiner*—Hoang Nguyen
(74) *Attorney, Agent, or Firm*—Sughrue Mion, PLLC

(57) ABSTRACT

A micro-actuator includes a shape memory thin film having one end fixed to a substrate and one remaining part which, at room temperature, is in the martensitic phase and assumes a curly-configuration, whereas at a higher temperature than a threshold value it changes to the austenitic condition, wherein the film is completely stretched upon the substrate.

2 Claims, 1 Drawing Sheet

SHAPE MEMORY THIN MICRO-ACTUATOR, AND METHOD FOR PRODUCING THE SAME

BACKGROUND OF THE INVENTION

The present invention relates to the use of shape memory thin films for carrying out micro-actuators usable in various applications in the micro-technologies field.

Metallurgy progresses allowed the application of shape memory materials in new and simplified embodiments, for example in the automotive field. A determinant factor of this development has been the increase of the cycles number and therefore of the actuator service life. Known applications constitute the engineering of mechanical components, such as shape memory wires or bars and use mechanical technologies of conventional type processing.

In the micro-technologies field, the use of shape memory materials is still at a research level.

SUMMARY OF THE INVENTION

Object of the present invention is to carry out an innovative type micro-actuator, exploiting the above-mentioned technologies. A further object of the invention is to integrate the technologies of shape memory alloy deposition with microelectronics typical processes, in order to produce thin film micro-actuators.

In view of attaining these and further purposes, the object of the invention is a micro-actuator, characterized in that it includes:
  a substrate,
  a thin film of a shape memory material (SMA), having a thickness not above 50 $\mu$m, preferably in the order of some micrometers, wherein the thin film has one end fixed to the substrate and the remaining part which, in a first resting configuration is curly-wrapped and in a second activation configuration is stretched on the substrate.

The activation condition can be obtained by heating the SMA film above a threshold temperature, for instance by passing through it an electric current.

Another object of the invention is a particular type of method to carry out the SMA micro-actuator above-described, having the features stated in the appended claims.

BRIEF DESCRIPTION OF THE DRAWINGS

Further features and advantages will result from the following description with reference to the enclosed drawings, which are given as not limitative example, wherein.

DETAILED DESCRIPTION OF THE INVENTION

Figure 1:
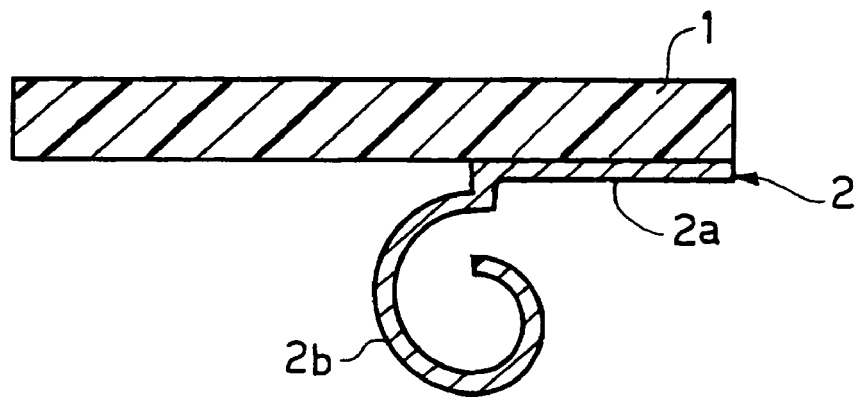
FIGS. 1, 2 show the preferred embodiment of the micro-actuator according to the invention, in the two different operating configurations of the shape memory thin film.
Figure 2:
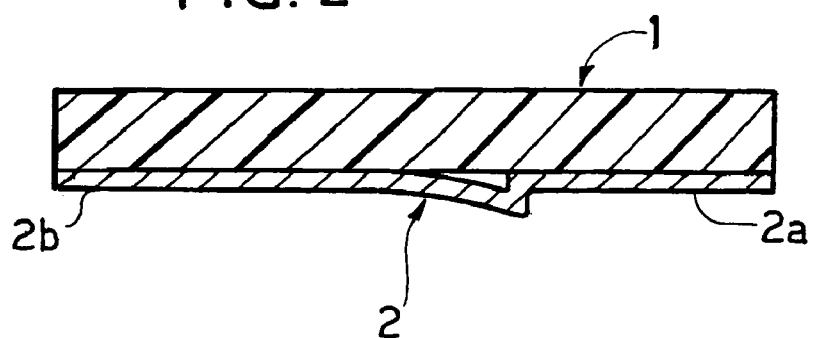

With reference to the drawings, numeral 1 is a substrate, for example silicon, on which a thin film 2 of a shape memory material is deposited. The thickness of the film 2 is not greater than 50 $\mu$m and preferably is some micrometers. Film 2 has an end portion 2a which is fixed to the substrate 1, and a remaining part 2b. The film is arranged in such a way that when it has a lower temperature than a predetermined threshold value, it assumes a first curly-configuration (FIG. 1), whereas when it has a higher temperature than this threshold value, it assumes a stretched configuration upon the substrate 1 (FIG. 2).

Figure 3:
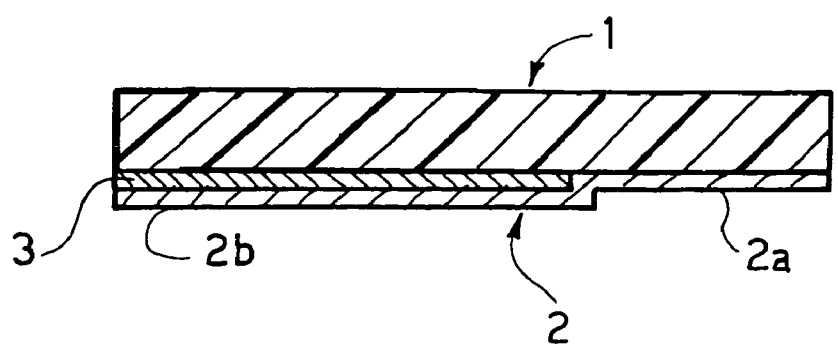
FIG. 3 is a further sectional view showing the process used for carrying out the device according to the invention.

In order to obtain the above-described arrangement, a film consisted of a shape memory nickel-titanium alloy is prepared. The film is deposited upon the substrate 1 at a controlled temperature, in order to condense in the austenitic phase. Typical thickness are 0.7–1 $\mu$m. The material composition is controlled through the crucible temperature and the starting powder composition, if it is a matter of "flash" vaporization, or by controlling the deposition parameters, such as "targets" composition, if the "sputtering" technology is exploited. The crucible-substrate distance is between 5 and 12 cm. Vacuum conditions of $10^{-6}$ torr or lower (preferably $10^{-7}$–$10^{-8}$ torr) are needed. The deposition is performed after a sacrificial layer 3 (FIG. 3) has been arranged. The removal of the sacrificial layer 3 causes the foil winding on itself. The winding is induced by varying the film characteristics during the deposition. For example, as to the nickel-titanium alloys, a $Ni_4Ti_3$ layer and a NiTi layer is formed in a 50/50 atomic concentration. This asymmetry leads to the film winding. Obviously, this is one of the possibility for obtaining the result. At room temperature, the material is in the martensitic phase (FIG. 1). By heating the same, it changes to the austenitic phase and then it returns in the stretched position upon the substrate, as when it has been deposited.

After deposition, a further heat treatment is possible, but not absolutely necessary. In the tests performed by the applicant, the best results have been obtained without a following heat treatment.

Obviously, without prejudice for the principle of the invention, construction details and embodiments could widely vary with respect to what has been described and shown by mere way of example, however without leaving the scope of the present invention.

What is claimed is:

1. A micro-actuator comprising a substrate, a thin film of a shape memory material having a thickness less than 50 $\mu$m wherein the shape memory film has an end portion fixed to the substrate and an entire remaining portion which is free to move between a first curly-wrapped resting configuration spaced from the substrate and a second activation configuration wherein the remaining portion is stretched on the substrate.

2. A method for obtaining a micro-actuator according to claim 1 providing a substrate having a sacrificial layer disposed on a portion of the substrate, depositing a thin film of shape memory material on the substrate and on the sacrificial layer by "flash" vaporization or "sputtering", whereby a portion of the film which is directly applied to the substrate without interposition of the substrate layer adheres to the substrate and removing the sacrificial layer whereby the thin film of shape memory material is induced to form a wound configuration of the thin film due to variations of the thin film during the deposition.

* * * * *